US007485922B2

(12) United States Patent
Otake et al.

(10) Patent No.: US 7,485,922 B2
(45) Date of Patent: Feb. 3, 2009

(54) ISOLATION STRUCTURE FOR SEMICONDUCTOR DEVICE INCLUDING DOUBLE DIFFUSION ISOLATION REGION FORMING PN JUNCTION WITH NEIGHBORING WELLS AND ISOLATION REGION BENEATH

(75) Inventors: Seiji Otake, Saitama (JP); Ryo Kanda, Gunma (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 133 days.

(21) Appl. No.: 11/526,869

(22) Filed: Sep. 26, 2006

(65) Prior Publication Data
US 2007/0075363 A1      Apr. 5, 2007

(30) Foreign Application Priority Data
Sep. 27, 2005    (JP) ............................. 2005-280520

(51) Int. Cl.
  *H01L 29/06*     (2006.01)
(52) U.S. Cl. ...................... 257/335; 257/545; 257/345; 257/544; 257/E29.019
(58) Field of Classification Search ................ 257/545, 257/546, 547, 548, 549, 336, 550, 500, 544, 257/E29.019, 657, 345, 191, 335, 597, 611, 257/607, E29.005, E29.06, E29.007
See application file for complete search history.

(56) References Cited

U.S. PATENT DOCUMENTS

| 4,910,160 | A  | * | 3/1990 | Jennings et al. ................ 438/17 |
| 5,218,224 | A  | * | 6/1993 | Taguchi ....................... 257/547 |
| 6,692,982 | B2 |   | 2/2004 | Takahashi et al. |
| 6,864,525 | B2 |   | 3/2005 | Kaneko et al. |

FOREIGN PATENT DOCUMENTS

| CN | 1428860 | 7/2003 |
| CN | 1435891 | 8/2003 |
| JP | 63-43343 | 2/1988 |
| JP | 2003-197793 | 7/2003 |

* cited by examiner

*Primary Examiner*—Anh D Mai
*Assistant Examiner*—Diana C Garrity
(74) *Attorney, Agent, or Firm*—Morrison & Foerster LLP

(57) ABSTRACT

In a semiconductor device of the present invention, an N type epitaxial layer is formed on a P type single crystal silicon substrate. The substrate and the epitaxial layer are partitioned into a plurality of element formation regions by isolation regions. Each of the isolation regions is formed of a P type buried diffusion layer and a P type diffusion layer coupled thereto. The P type buried diffusion layer is joined to N type buried diffusion layers on both sides thereof to form PN junction regions. On the other hand, the P type diffusion layer is joined to N type diffusion layers on both sides thereof to form PN junction regions. This structure suppresses extension of widthwise diffusion of the P type buried diffusion layer and the P type diffusion layer, thus making it possible to reduce the device size.

3 Claims, 8 Drawing Sheets

Prior Art

ISOLATION STRUCTURE FOR SEMICONDUCTOR DEVICE INCLUDING DOUBLE DIFFUSION ISOLATION REGION FORMING PN JUNCTION WITH NEIGHBORING WELLS AND ISOLATION REGION BENEATH

BACKGROUND OF THE INVENTION

Priority is claimed to Japanese Patent Application Number JP2005-280520 filed on Sep. 27, 2005, the disclosure of which is incorporated herein by reference in its entirety.

1. Field of the Invention

The present invention relates to a semiconductor device which achieves reduction in device size by suppressing extension of diffusion of its isolation region, and a method of manufacturing the semiconductor device.

2. Description of the Related Art

In a conventional semiconductor device, an N type epitaxial layer is formed on a P type single crystal silicon substrate. The substrate and the epitaxial layer are partitioned into a plurality of island regions by a P type isolation region. Formed in each of the island regions is, for example, an N channel type MOS transistor, a P channel type MOS transistor, an NPN bipolar transistor, or the like. The P type isolation region is diffused by a thermal diffusion method in a direction of the depth and in a direction of the width of the substrate and the epitaxial layer, to form PN junction regions with the N type epitaxial layer. This technology is described for instance in Japanese Patent Application Publication No. 2003-197793, pp. 5 and 6, and FIG. 1.

In the conventional semiconductor device, each of diffusion layers which constitute the isolation region is diffused in a direction of the depth and in a direction of the width as mentioned above. Various elements such as the N channel type MOS transistor are formed in the regions which are partitioned by the isolation region. Here a P type diffusion layer which constitutes the isolation region forms the PN junction regions with a lowest-concentration N type region such as the epitaxial layer which constitutes the element. However, the conventional semiconductor device has the problem that it is difficult to achieve reduction in device size, since the P type diffusion layer which constitutes the isolation region diffuses widely in a direction of the width, where its extension of diffusion is not suppressed, because of a structure in which the P type diffusion layer is in contact with the lowest-concentration N type region.

Moreover, in a conventional method of manufacturing a semiconductor device, a P type buried diffusion layer is formed from a boundary between a substrate and an epitaxial layer, a P type diffusion layer is formed from the surface of the epitaxial layer, and isolation region is formed by coupling the both diffusion layers. The P type buried diffusion layer diffuses widely in a direction of the width because of containing a high concentration of impurities and hence requiring a long time for heat treatment. Accordingly, there is a problem that it is difficult to achieve reduction in device size.

SUMMARY OF THE INVENTION

The present invention was made in consideration of the foregoing problems. A semiconductor device of the present invention includes an isolation region which partition a semiconductor layer into a plurality of element formation regions, a first semiconductor element formed in a first of the element formation regions, and a second semiconductor element formed in a second of the element formation regions, the second element formation region being adjacent to the first element formation region. The semiconductor device includes that a plurality of first conduction type diffusion layers are coupled to form the isolation region located between the first and second of the element formation regions, and the first conduction type diffusion layers are respectively joined to second conduction type diffusion layers, which respectively constitute the first and second semiconductor elements, to thereby form PN junction regions. Therefore, the semiconductor device of the present invention makes it possible to reduce device size by suppressing extension of diffusion of the first conduction type diffusion layers which constitute the isolation region.

Moreover, the semiconductor device of the present invention includes that the first conduction type diffusion layers, which constitute the isolation region and which are formed from a surface of the semiconductor layer, are formed by superposing a plurality of diffusion layers having different impurity concentrations, and a first conduction type diffusion layer having the lowest impurity concentration forms the PN junction regions. Therefore, the semiconductor device of the present invention makes it possible to improve withstand voltage characteristics by setting the impurity concentration in the first conduction type diffusion layer lower in the vicinity of the PN junction region.

Moreover, the semiconductor device of the present invention includes that the first conduction type diffusion layers formed from the surface of the semiconductor layer are formed by superposing the plurality of diffusion layers in a way that a diffusion layer closer to the center thereof has higher impurity concentrations. Therefore, the semiconductor device of the present invention can reduce resistance of the isolation region, and can prevent inversion of the surface of the isolation region due to a metal wiring layer, by setting the impurity concentration in the isolation region higher in the vicinity of the surface of the semiconductor layer.

A method of manufacturing a semiconductor device of the present invention includes the steps of: preparing a first conduction type semiconductor substrate, forming a first conduction type buried diffusion layer for an isolation region, and second conduction type buried diffusion layers for semiconductor elements, in the substrate, forming a second conduction type epitaxial layer on the substrate, and thereafter forming first conduction type diffusion layers for the isolation region and second conduction type diffusion layers for the semiconductor elements, from a surface of the epitaxial layer. In the method: the first and second conduction type buried diffusion layers are joined to form a PN junction region, whereby the second conduction type buried diffusion layers suppress widthwise diffusion of the first conduction type buried diffusion layer, and the first and second conduction type diffusion layers are joined to form the PN junction region, whereby the second conduction type diffusion layers suppress widthwise diffusion of the first conduction type diffusion layer. Therefore, in the present invention, the second conduction type buried diffusion layer and the second conduction type diffusion layer suppress widthwise diffusion of the first conduction type buried diffusion layer and the first conduction type diffusion layer which constitute the isolation region. Thus, the present invention makes it possible to reduce the device size by suppressing extension of diffusion of the isolation region.

Moreover, the method of manufacturing a semiconductor device of the present invention includes that the first conduction type diffusion layers are formed by superposing a plurality of diffusion layers having different impurity concentrations, and a first conduction type diffusion layer having the lowest impurity concentration is formed with the greatest width and is joined to the second conduction type diffusion layers to form the PN junction region. Therefore, in the present invention, the diffusion layer having the lowest impurity concentration is located on the outermost periphery of the first conduction type diffusion layer. Thus, the present invention makes it possible to improve the withstand voltage characteristics by reducing the impurity concentration in the first conduction type diffusion layer in the vicinity of the PN junction region.

DESCRIPTION OF THE EMBODIMENTS

Figure 1:
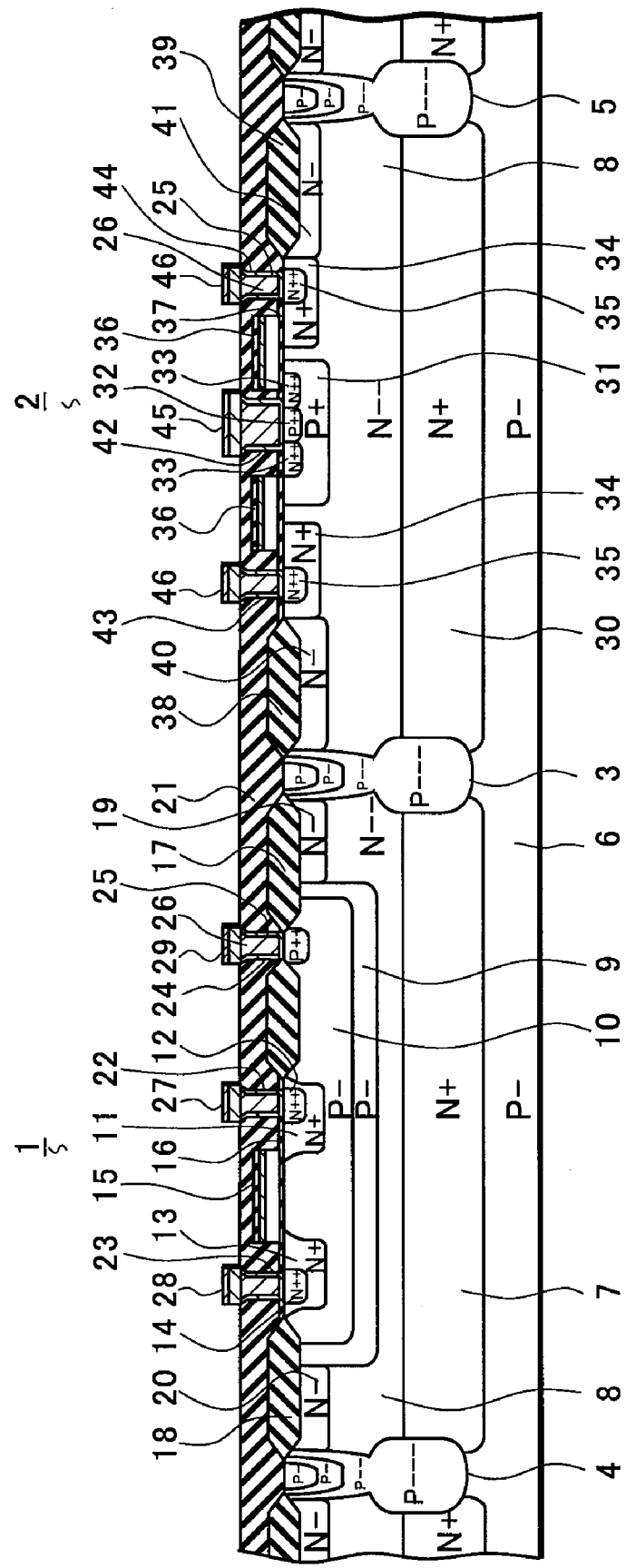
FIG. 1 is a cross-sectional view for explaining a semiconductor device according to an embodiment of the present invention.
Figure 2A:
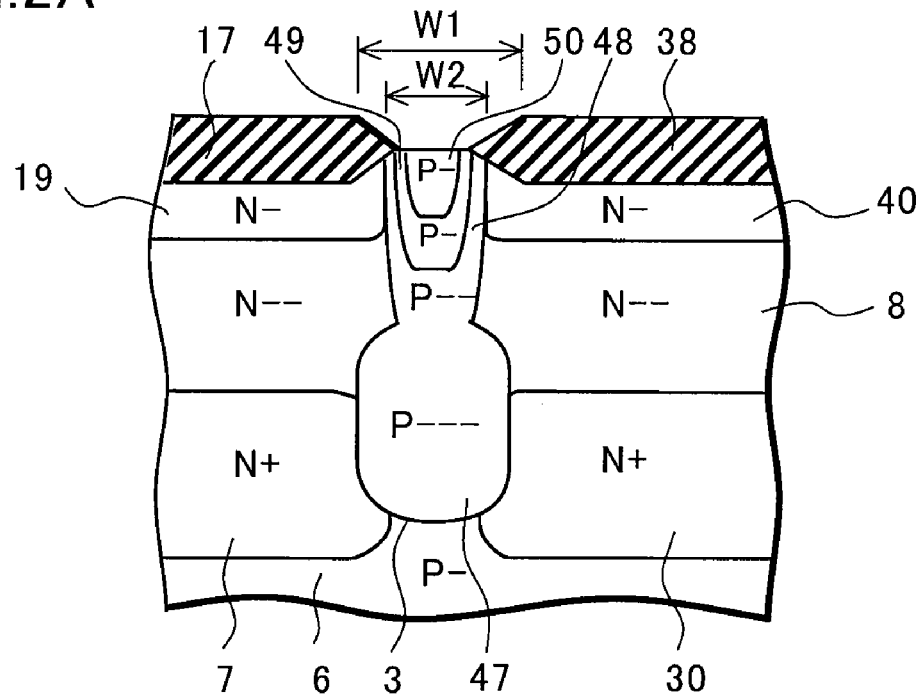
FIG. 2A is a cross-sectional view for explaining the semiconductor device according to the embodiment of the present invention.
Figure 2B:
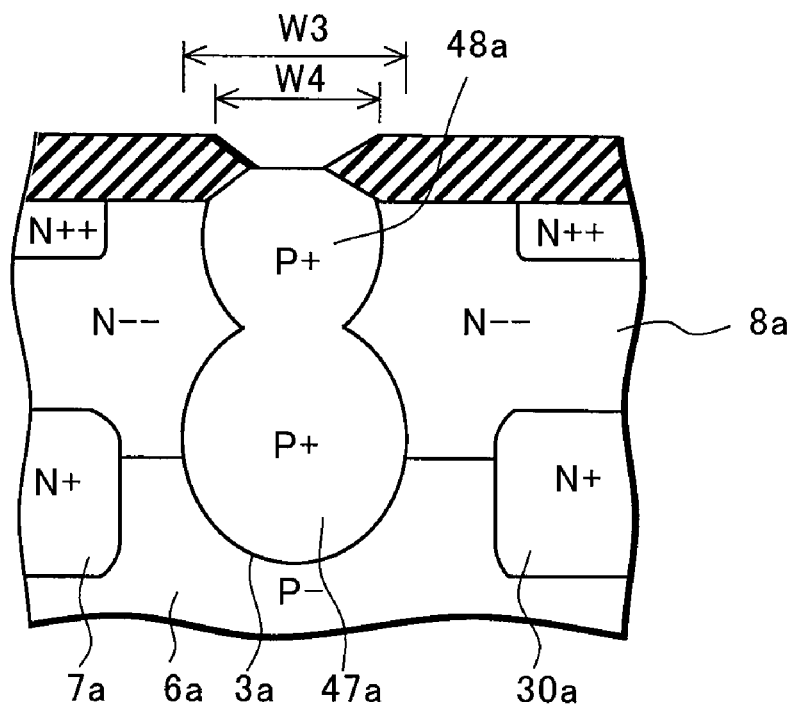
FIG. 2B is a cross-sectional view for explaining a semiconductor device according to the related art embodiment.
Figure 3:
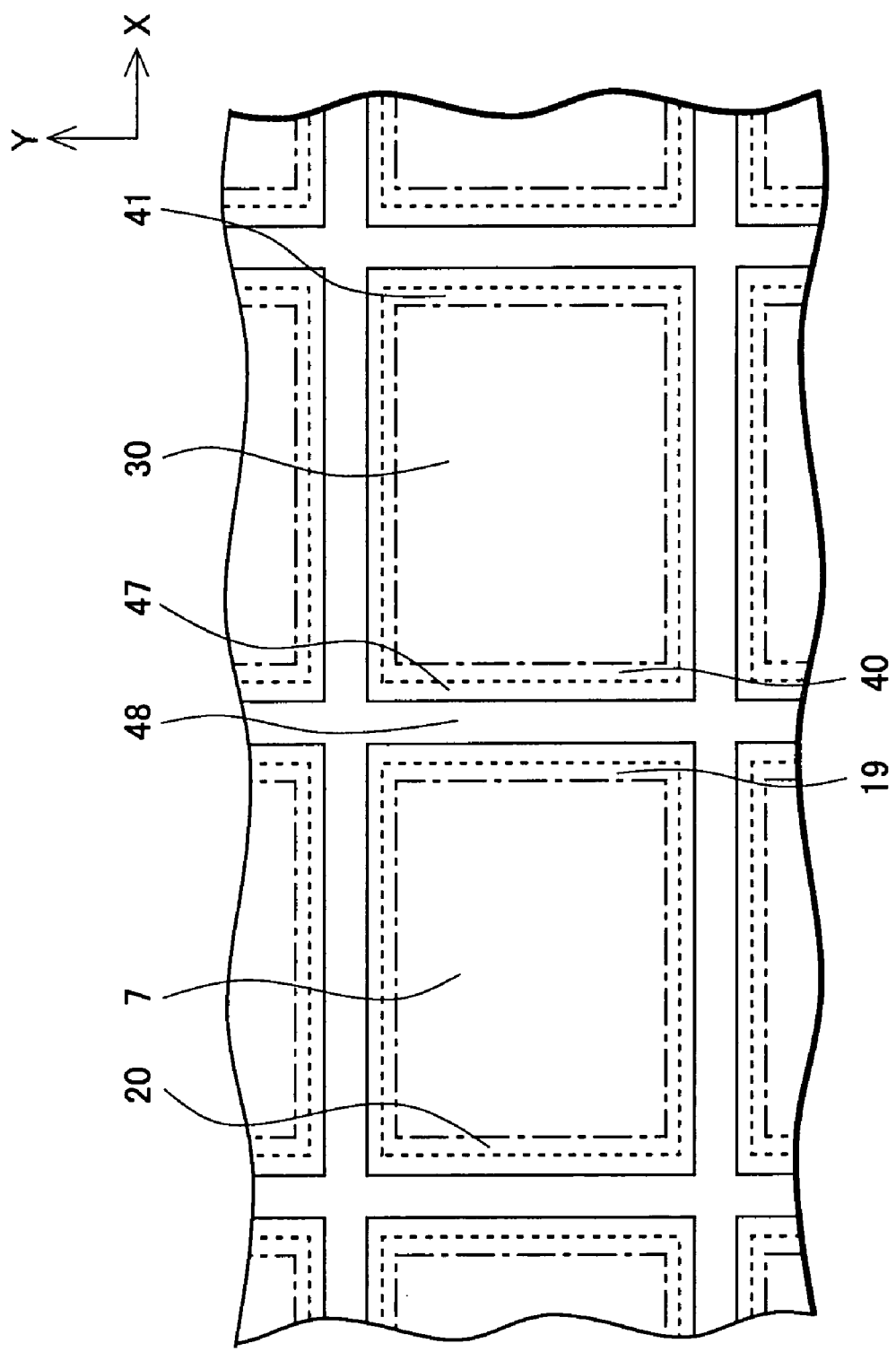
FIG. 3 is a top view for explaining the semiconductor device according to embodiment of the present invention.

A semiconductor device according to one embodiment of the present invention will be described in detail below with reference to FIGS. 1 to 3. FIG. 1 is a cross-sectional view for explaining the semiconductor device according to the embodiment. FIG. 2A is a cross-sectional view for explaining the semiconductor device according to the embodiment. FIG. 2B is a cross-sectional view for explaining a conventional semiconductor device. FIG. 3 is a top view for explaining the semiconductor device.

As shown in FIG. 1, an N channel type DMOS (double diffused metal oxide semiconductor) transistor 1 is formed in a first of element formation regions which are partitioned by isolation regions 3, 4 and 5; and an N channel type LDMOS (lateral double diffused metal oxide semiconductor) transistor 2 is formed in a second of the element formation regions. Incidentally, the description is given herein with regard to the embodiment in which the N channel type DMOS transistor 1 and the N channel type LDMOS transistor 2 are employed, it is to be understood that the present invention is not limited to the embodiment. An NPN transistor and a pnp transistor, for example, may be employed.

Firstly, the N channel type DMOS transistor 1 is configured mainly with a P type single crystal silicon substrate 6, an N type buried diffusion layer 7, an N type epitaxial layer 8, P type diffusion layers 9 and 10 to be used as back gate regions, N type diffusion layers 11 and 12 to be used as source regions, N type diffusion layers 13 and 14 to be used as drain regions, and a gate electrode 15.

The N type epitaxial layer 8 is formed on the P type single crystal silicon substrate 6. The N type buried diffusion layer 7 is formed between the substrate 6 and the epitaxial layer 8. Incidentally, the description is given herein with regard to a case where the single epitaxial layer 8 is formed on the substrate 6, it is to be understood that the present invention is not limited to this case. For example, the embodiment of the present invention may be formed of a substrate alone or may be formed of a substrate and a plurality of epitaxial layers deposited on a top surface of the substrate. Moreover, the substrate may be made of an N type single crystal silicon substrate or a compound semiconductor substrate.

The P type diffusion layer 9 is formed in the epitaxial layer 8. The P type diffusion layer 10 is formed in the P type diffusion layer 9 in such a manner that the P type diffusion layer 10 is superposed on the P type diffusion layer 9. The P type diffusion layers 9 and 10 are used as the back gate regions. Incidentally, the P type diffusion layers 9 and 10 will hereinafter be described as the P type diffusion layer 9, since the P type diffusion layers 9 and 10 are formed by being superposed on each other.

The N type diffusion layers 11 and 13 are formed in the P type diffusion layer 9. The N type diffusion layer 11 is used as the source region. The N type diffusion layer 13 is used as the drain region. The N type diffusion layer 12 is formed in the N type diffusion layer 11, and the N type diffusion layer 14 is formed in the N type diffusion layer 13. With this structure, the drain region becomes a DDD (double diffused drain) structure. The P type diffusion layer 9 located between the N type diffusion layers 11 and 13 is used as a channel region. Silicon oxide film 16 on a top surface of the epitaxial layer 8, which is located above the channel region, is used as a gate oxide film.

The gate electrode 15 is formed on a top surface of the gate oxide film. The gate electrode 15 is made of a polysilicon film and a tungsten silicide (WSi) film, and is formed with a desired film thickness. A silicon oxide film is formed on a top surface of the tungsten silicide film.

LOCOS (local oxidation of silicon) oxide films 17 and 18 are formed in the epitaxial layer 8. Each flat portion of the LOCOS oxide films 17 and 18 has a film thickness of, for example, about 3000 to 10000 (Å). N type diffusion layers 19 and 20 are formed under the LOCOS oxide films 17 and 18, respectively, which are located between the P type diffusion layer 9 and the P type isolation regions 3 and 4, respectively. The N type diffusion layers 19 and 20 prevent the surface of the epitaxial layer 8 from inverting, and thus prevent short circuits from occurring across the P type diffusion layer 9 and the P type isolation regions 3 and 4.

An insulating layer 21 is formed on the top surface of the epitaxial layer 8. The insulating layer 21 is made of a BPSG (boron phospho silicate glass) film, a SOG (spin on glass) film, or the like. Contact holes 22, 23 and 24 are formed in the insulating layer 21 by using heretofore known photolithography technology for dry etching using $CHF_3+O_2$ base gas, for example.

A barrier metal film 25 and a tungsten (W) film 26 are buried in each of the contact holes 22, 23 and 24. Aluminum alloy (e.g., aluminum-copper (Al—Cu) or aluminum-silicon-copper (Al—Si—Cu)) films and barrier metal films are selectively formed on the surfaces of the tungsten films 26 to thereby form a source electrode 27, a drain electrode 28 and a back gate electrode 29. Incidentally, a wiring layer connected to the gate electrode 15, although not shown in the cross-section of FIG. 1, is provided in other regions.

On the other hand, the N channel type LDMOS transistor 2 is configured mainly with the P type single crystal silicon substrate 6, an N type buried diffusion layer 30, the N type epitaxial layer 8, P type diffusion layers 31 and 32 to be used as back gate regions, an N type diffusion layer 33 to be used as a source region, N type diffusion layers 34 and 35 to be used as drain regions, and a gate electrode 36.

The N type epitaxial layer 8 is formed on the P type single crystal silicon substrate 6. The N type buried diffusion layer 30 is formed between the substrate 6 and the epitaxial layer 8.

The P type diffusion layer 31 is formed in the epitaxial layer 8. The P type diffusion layer 32 is formed in the P type diffusion layer 31 in such a manner that the P type diffusion layer 32 is superposed on the P type diffusion layer 31. The P type diffusion layers 31 and 32 are used as the back gate regions.

The N type diffusion layer 33 is formed in the P type diffusion layer 31. The N type diffusion layer 33 is used as the source region. The N type diffusion layer 33 and the P type diffusion layer 32 are connected to a source electrode 45 and are at the equal potential.

The N type diffusion layers 34 and 35 are formed in the epitaxial layer 8. The N type diffusion layers 34 and 35 are used as the drain regions. The P type diffusion layer 31, which is located under the gate electrode 36 and which is located between the N type diffusion layers 33 and 34, is used as a channel region. Silicon oxide film 37 on a top surface of the epitaxial layer 8, which is located above the channel region, is used as a gate oxide film.

The gate electrode 36 is formed on a top surface of the gate oxide film. The gate electrode 36 is made of, for example, a polysilicon film and a tungsten silicide (WSi) film, and is formed with a desired film thickness. A silicon oxide film is formed on a top surface of the tungsten silicide film.

LOCOS oxide films 38 and 39 are formed in the epitaxial layer 8. Each flat portion of the LOCOS oxide films 38 and 39 has a film thickness of, for example, about 3000 to 10000 (Å). N type diffusion layers 40 and 41 are formed under the LOCOS oxide films 38 and 39, respectively, which are located between the N type diffusion layer 34 and the P type isolation regions 3 and 5, respectively. The N type diffusion layers 40 and 41 prevent the surface of the epitaxial layer 8 from inverting.

Contact holes 42, 43 and 44 are formed in the insulating layer 21. The barrier metal film 25 and the tungsten (W) film 26 are buried in each of the contact holes 42, 43 and 44. Aluminum alloy (e.g., aluminum-copper (Al—Cu) or aluminum-silicon-copper (Al—Si—Cu)) films and barrier metal films are selectively formed on the surfaces of the tungsten films 26, to thereby form the source electrode 45 and a drain electrode 46. Incidentally, a wiring layer connected to the gate electrode 36, although not shown in the cross-section of FIG. 1, is provided in other regions.

As shown in FIG. 2A, the isolation region 3 is configured with a P type buried diffusion layer 47 formed diffusing across the substrate 6 and the epitaxial layer 8, and P type diffusion layers 48, 49 and 50 formed diffusing from the surface of the epitaxial layer 8.

The P type buried diffusion layer 47 is formed as surrounding the element formation region of the DMOS transistor 1 and the element formation region of the LDMOS transistor 2. In a region where the element formation region of the DMOS transistor 1 is adjacent to the element formation region of the LDMOS transistor 2, the P type buried diffusion layer 47 is disposed as interposed in between the N type buried diffusion layer 7 of the DMOS transistor 1 and the N type buried diffusion layer 30 of the LDMOS transistor 2. The P type buried diffusion layer 47 is joined to the N type buried diffusion layers 7 and 30 to form PN junction regions.

Here, the P type buried diffusion layer 47 is formed by ion implantation with P type impurities, such as boron (B), the dose of which lies between $1.0 \times 10^{11}$ and $1.0 \times 10^{13}$ (/c m$^2$) inclusive. On the other hand, the N type buried diffusion layers 7 and 30 are each formed by ion implantation with N type impurities, such as phosphorus (P), the dose of which lies between $1.0 \times 10^{12}$ and $1.0 \times 10^{14}$ (/c m$^2$) inclusive. A difference between the doses of the impurities offsets P type and N type impurity concentrations in regions where the P type buried diffusion layer 47 diffusedly formed is superposed on the N type buried diffusion layers 7 and 30 diffusedly formed. Thus, the N type buried diffusion layers 7 and 30 suppress the widthwise diffusion of the P type buried diffusion layer 47, and hence reduce a diffusion width W1 of the P type buried diffusion layer 47. The impurity concentration in the P type buried diffusion layer 47 and the impurity concentrations in the N type buried diffusion layers 7 and 30 are determined by taking into account the withstand voltage characteristics in the PN junction regions formed by the diffusion layer 47 and the diffusion layers 7 and 30.

Incidentally, the N type buried diffusion layers 7 and 30 are formed across each of element formation regions, although only one cross-section is shown in FIGS. 1 and 2A. Accordingly, this structure also suppresses the widthwise diffusion of the P type buried diffusion layer surrounding the element formation regions of the DMOS transistor 1 and the LDMOS transistor 2.

The P type diffusion layer 48 is formed as surrounding the element formation region of the DMOS transistor 1 and the element formation region of the LDMOS transistor 2. The P type diffusion layer 48 is formed on a formation region of the P type buried diffusion layer 47, and the diffusion layer 48 is coupled to the buried diffusion layer 47 to form the isolation region 3. In the region where the element formation region of the DMOS transistor 1 is adjacent to the element formation region of the LDMOS transistor 2, the P type diffusion layer 48 is disposed as interposed in between the N type diffusion layer 19 of the DMOS transistor 1 and the N type diffusion layer 40 of the LDMOS transistor 2. The P type diffusion layer 48 is joined to the N type diffusion layers 19 and 40 to form PN junction regions.

Here, the P type diffusion layer 48 is formed by ion implantation with P type impurities, such as boron (B), the dose of which lies between $1.0 \times 10^{12}$ and $1.0 \times 10^{14}$ (/c m$^2$) inclusive. On the other hand, the N type diffusion layers 19 and 40 are each formed by ion implantation with N type impurities, such as phosphorus (P), the dose of which lies between $1.0 \times 10^{12}$ and $1.0 \times 10^{14}$ (/c m$^2$) inclusive. A difference between the doses of the impurities offsets P type and N type impurity concentrations in regions where the P type diffusion layer 48 diffusedly formed is superposed on the N type diffusion layers 19 and 40 diffusedly formed. Thus, the N type diffusion layers 19 and 40 suppress the widthwise diffusion of the P type diffusion layer 48, and hence reduce a diffusion width W2 of the P type diffusion layer 48. The impurity concentration in the P type diffusion layer 48 and the impurity concentrations in the N type diffusion layers 19 and 40 are determined by taking into account the withstand voltage characteristics in the PN junction regions formed by the diffusion layer 48 and the diffusion layers 19 and 40.

The P type diffusion layers 49 and 50 are formed in the P type diffusion layer 48 in such a manner that formation regions of the P type diffusion layers 48, 49 and 50 are superposed on one another. The P type diffusion layers 49 and 50 are formed in the formation regions of the P type diffusion layers 48 and 49, respectively, so that the P type diffusion layers 48, 49 and 50 are formed in a triple diffused structure. In other words, the P type diffusion layers 48 and 50 are formed to have maximum and minimum diffusion widths, respectively.

Here, the P type diffusion layer 49 is formed by ion implantation with P type impurities, such as boron (B), the dose of which lies between $5.0 \times 10^{12}$ and $1.0 \times 10^{14}$ (/c m$^2$) inclusive. The P type diffusion layer 50 is formed by ion implantation with P type impurities, such as boron (B), the dose of which lies between $1.0 \times 10^{13}$ and $1.0 \times 10^{15}$ (/c m$^2$) inclusive.

With this structure, in a region where the P type diffusion layers 48, 49 and 50 of the isolation region 3 are formed, the impurity concentration becomes higher toward the center of the region. Thus, it is possible to reduce resistance of the isolation region, and to prevent inversion of the surface of the isolation region due to a metal wiring layer. Moreover, the impurity concentration becomes lower toward the outer periphery of the isolation region 3. Thus, it is possible to form the PN junction regions with lower-concentration impurity regions, so that the withstand voltage characteristics can be improved.

As shown in FIG. 2B, an isolation region 3a of a conventional semiconductor device is configured with a P type buried diffusion layer 47a formed across a substrate 6a and an epitaxial layer 8a, and P type diffusion layer 48a formed from the surface of the epitaxial layer 8a. The P type buried diffusion layer 47a and the P type diffusion layer 48a are joined to the N type epitaxial layer 8a to form PN junction regions. The isolation region 3a of the conventional device has a structure in which the N type epitaxial layer 8a is a low-concentration impurity region, and the P type buried diffusion layer 47a and the P type diffusion layer 48a contain high concentrations of impurities taking into account reduction in the resistance of the isolation region, or the like. Accordingly, a diffusion with W4 of the P type diffusion layer 48a increases without its widthwise diffusion being suppressed by N type diffusion layers. On the other hand, a diffusion width W3 of the P type buried diffusion layer 47a increases without its widthwise diffusion being suppressed by N type buried diffusion layers 7a and 30a. In other words, the conventional device has the problem that it is difficult to achieve reduction in device size, because of difficulty in suppressing the expansion of the diffusion widths W4 and W3 of the P type diffusion layer 48a and P type buried diffusion layer 47a of the isolation region 3a. Particularly, the conventional device has the problem that it is difficult to narrow the diffusion width W3 of the P type buried diffusion layer 47a, since the P type buried diffusion layer 47a is prone to diffuse in a direction of the width because of requiring more time for heat treatment and containing a higher concentration of impurities.

In other words, reduction in device size can be accomplished by suppressing the widthwise diffusion of the isolation region 3, so that a relation between the widths W1 and W3 respectively of the P type buried diffusion layers 47 and 47a satisfies an equation W3>W1, and a relation between the widths W2 and W4 respectively of the P type diffusion layers 48 and 48a satisfies an equation W4>W2, as shown in FIGS. 2A and 2B. When the impurity concentrations in the P type buried diffusion layer 47 and the P type diffusion layer 48 are set low, it is possible to maintain the withstand voltage characteristics within a desired range in its PN junction regions. Since the structures of the isolation regions 4 and 5 are similar to the structure of the isolation region 3 previously mentioned, the description thereof is omitted.

As reference to FIG. 3, a region which is indicated by a solid line and is provided as extending to the X axial direction and Y axial direction indicates a P type diffusion layer of the isolation region. For example, it corresponds to the P type diffusion layer 48 shown in FIG. 2A. Moreover, a region which is indicated by a dotted line and is provided as extending to the X axial direction and Y axial direction indicates a P type buried diffusion layer of the isolation region. For example, it corresponds to the P type buried diffusion layer 47 shown in FIG. 2A. Therefore, the regions which are enclosed by the solid line and the dotted line indicate the N type diffusion layers. For example, they respectively correspond to N type diffusion layers 19, 20, 40 and 41 shown in FIG. 1. Moreover, the regions which are enclosed by the dotted line indicate the N type buried diffusion layers. For example, they respectively correspond to the N type buried diffusion layers 7 and 30 shown in FIG. 1. As mentioned above, the isolation regions 3, 4 and 5 shown in FIG. 1 are provided as enclosing the N type buried diffusion layers 7 and 30.

A method of manufacturing a semiconductor device according to one embodiment of the present invention will now be described in detail with reference to FIGS. 4 to 8. FIGS. 4 to 8 are cross-sectional views for explaining the method of manufacturing the semiconductor device according to the embodiment of the present invention.

Figure 4:
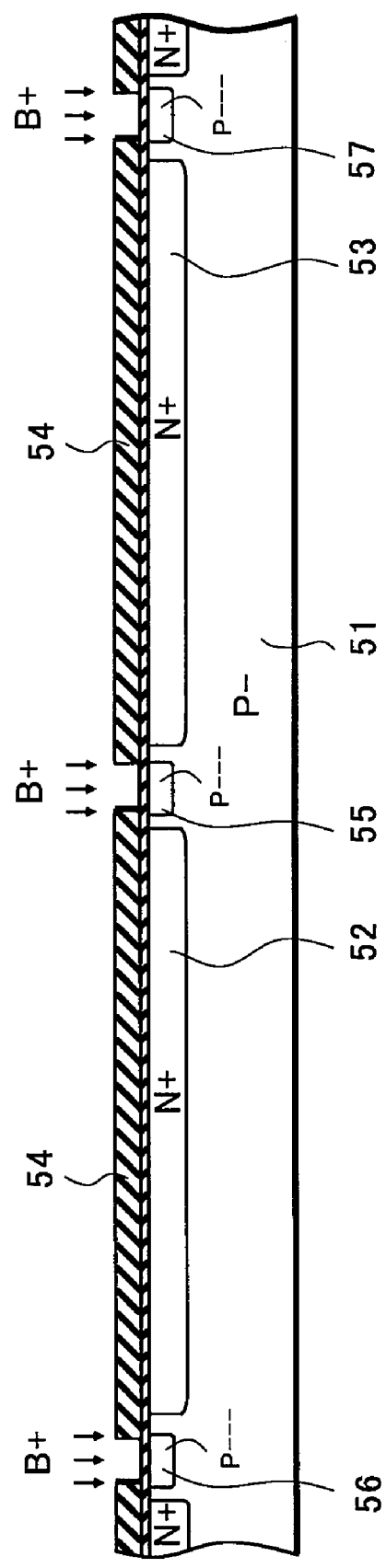
FIG. 4 is a cross-sectional view for explaining a method of manufacturing a semiconductor device according to an embodiment of the present invention.

First of all, as shown in FIG. 4, a P type single crystal silicon substrate 51 is prepared. By using heretofore known photolithography technology, ions of an N type impurity, such as phosphorus (P), the dose of which lies between $1.0 \times 10^{12}$ and $1.0 \times 10^{14}$ (/c m$^2$) inclusive, are implanted to the surface of the substrate 51, to thereby form N type buried diffusion layers 52 and 53.

Then, a photoresist 54 is formed on the substrate 51. Openings are then formed, by using heretofore known photolithography technology, in the photoresist 54 on regions where P type buried diffusion layers 55, 56 and 57 are to be formed. Thereafter, ions of a P type impurity, such as boron (B), are implanted to the surface of the substrate 51, under conditions where an accelerating voltage lies between 140 and 180 (keV) inclusive and a dose lies between $1.0 \times 10^{11}$ and $1.0 \times 10^{13}$ (/c m$^2$) inclusive, thereby to form the P type buried diffusion layers 55, 56 and 57.

Figure 5:
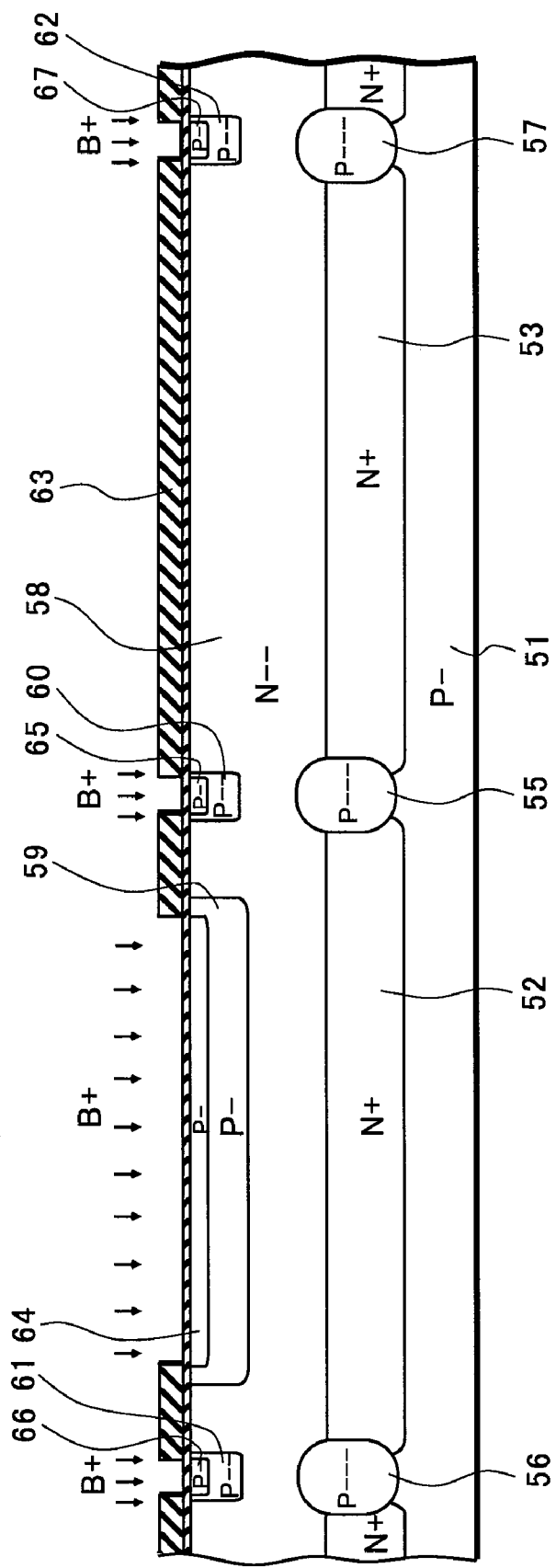
FIG. 5 is a cross-sectional view for explaining the method of manufacturing the semiconductor device according to the embodiment of the present invention.

As shown in FIG. 5, the substrate 51 is then placed on a susceptor in an epitaxial growth system. Then, ramp heating is performed to heat the substrate 51 to a high temperature of, for example, about 1200° C., and also, trichlorosilane (SiHCl$_3$) gas and hydrogen (H$_2$) gas are introduced into a reaction tube. By this process, an epitaxial layer 58 having resistivity of, for example, about 0.1 to 2.0 (Ω·cm) and a thickness of, for example, about 1.0 to 10.0 (µm) is grown on the substrate 51.

Then, by using heretofore known photolithography technology, ions of a P type impurity, such as boron (B), are implanted to the surface of the epitaxial layer 58, under conditions where an accelerating voltage lies between 140 and 180 (keV) inclusive and a dose lies between $1.0 \times 10^{12}$ and $1.0 \times 10^{14}$ (/c m$^2$) inclusive, thereby to form P type diffusion layers 59, 60, 61 and 62. A photoresist 63 is then formed on the epitaxial layer 58. Openings are then formed, by using heretofore known photolithography technology, in the photoresist 63 on regions where P type diffusion layers 64, 65, 66 and 67 are to be formed. Thereafter, ions of a P type impurity, such as boron (B), are implanted under conditions where an accelerating voltage lies between 140 and 180 (keV) inclusive and a dose lies between $5.0 \times 10^{12}$ and $1.0 \times 10^{14}$ (/c m$^2$) inclusive, thereby to form the P type diffusion layers 64, 65, 66 and 67.

At this time, to selectively etch away the photoresist 63 formed on the epitaxial layer 58, the openings are formed in the photoresist 63 so that the diffusion widths of the P type diffusion layers 65, 66 and 67 are smaller than those of the P type diffusion layers 60, 61 and 62, respectively. Moreover, the ion implantation is performed so that the peaks of impurity concentrations in the P type diffusion layers 65, 66 and 67 are present closer to the surface of the epitaxial layer 58 than the peaks of impurity concentrations in the P type diffusion layers 60, 61 and 62, respectively.

Figure 6:
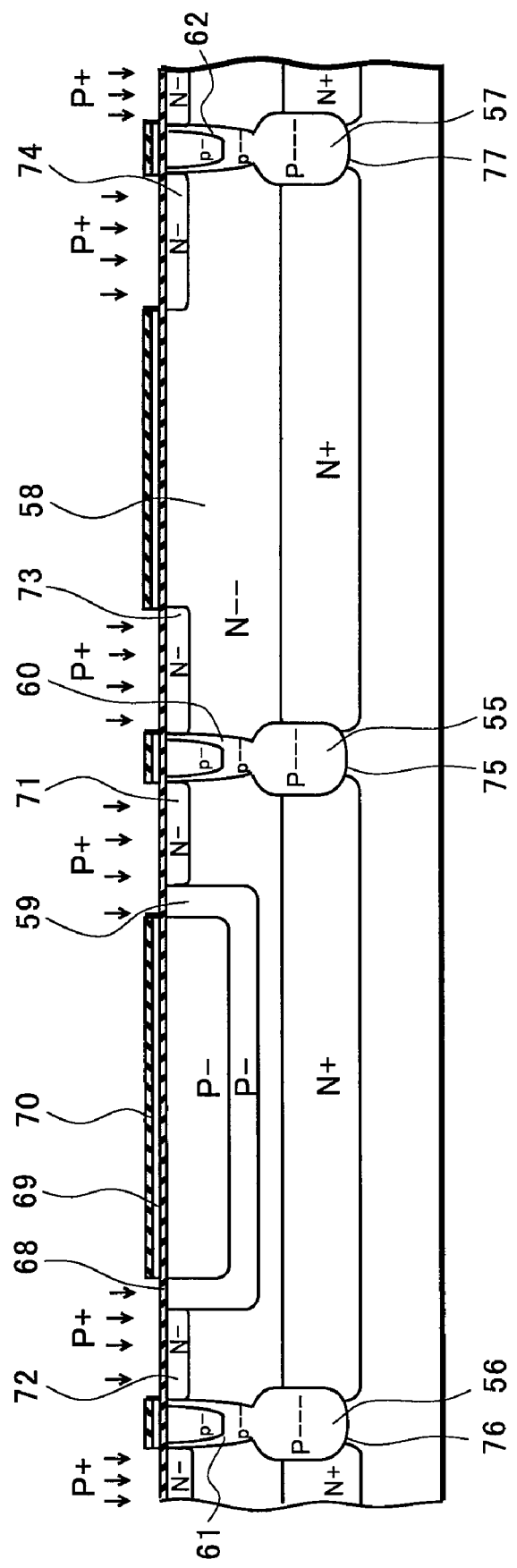
FIG. 6 is a cross-sectional view for explaining the method of manufacturing the semiconductor device according to the embodiment of the present invention.

As shown in FIG. 6, a silicon oxide film 68, a polysilicon film 69 and a silicon nitride film 70 are then deposited in sequence on the surface of the epitaxial layer 58. The polysilicon film 69 and the silicon nitride film 70 are selectively etched away so that openings are provided in portions where LOCOS oxide films 78, 79, 80 and 81 (see FIG. 7) are to be formed. Then, ions of an N type impurity, such as phosphorus (P), are implanted under conditions where an accelerating voltage lies between 140 and 180 (keV) inclusive and a dose lies between $1.0 \times 10^{12}$ and $1.0 \times 10^{14}$ (/c m$^2$) inclusive, thereby to form N type diffusion layers 71, 72, 73 and 74. Incidentally, the P type buried diffusion layers 55, 56 and 57 are coupled to the P type diffusion layers 60, 61 and 62, respectively, to form isolation regions 75, 76 and 77, respectively. Moreover, N type and P type impurity concentrations are offset in a region where the N type diffusion layers 71 and 72 are superposed on the P type diffusion layer 59, so that the region becomes the P type diffusion layer 59.

Figure 7:
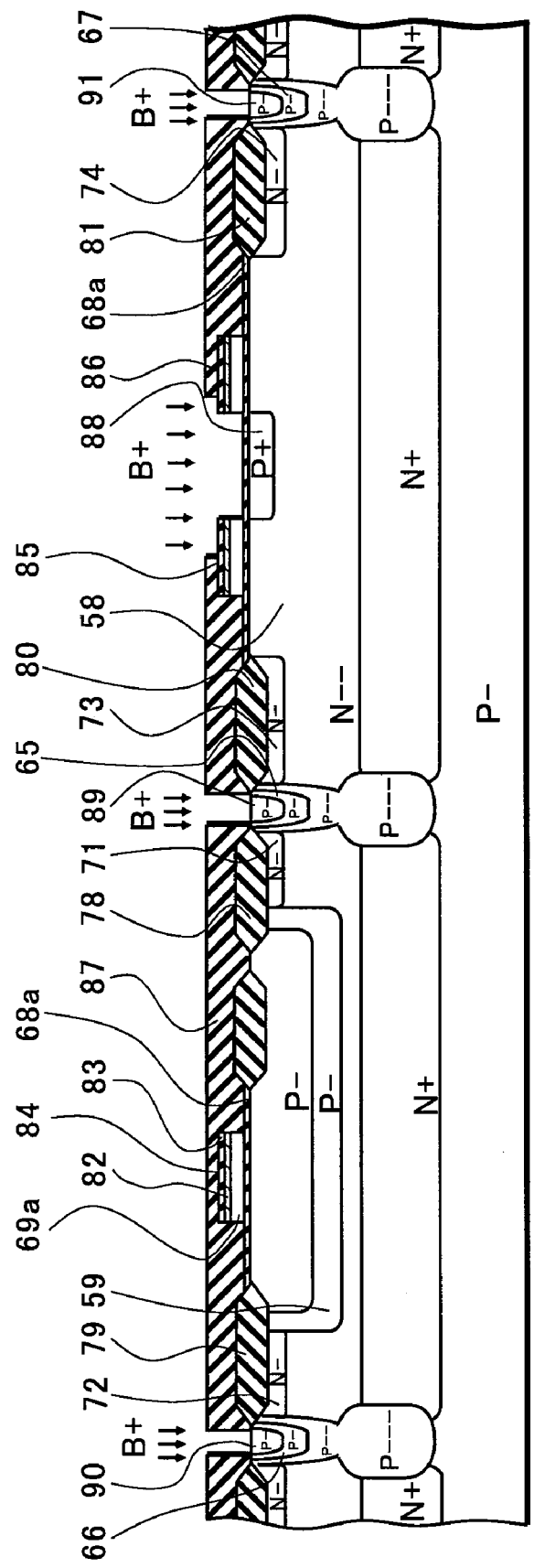
FIG. 7 is a cross-sectional view for explaining the method of manufacturing the semiconductor device according to the embodiment of the present invention.

As shown in FIG. 7, the LOCOS oxide films 78, 79, 80 and 81 are then formed utilizing the openings formed in the polysilicon film 69 and the silicon nitride film 70. At this time, the utilization of the openings formed in the polysilicon film 69 and the silicon nitride film 70 makes it possible to form the N type diffusion layers 71, 72, 73 and 74 respectively to the LOCOS oxide films 78, 79, 80 and 81, with good position accuracy. Then, the silicon oxide film 68, the polysilicon film 69 and the silicon nitride film 70 remaining between the adjacent films of the LOCOS oxide films 78, 79, 80 and 81 are etched away. Then, a silicon oxide film 68a, a polysilicon film 69a, a tungsten silicide film 82 and a silicon oxide film 83 are deposited in sequence on a top surface of the epitaxial layer 58. Thereafter, the polysilicon film 69a and the tungsten silicide film 82 are selectively etched away by using heretofore known photolithography technology to thereby form gate electrodes 84, 85 and 86. Incidentally, the silicon oxide film 68a under each of the gate electrodes 84, 85 and 86 is used as a gate oxide film.

Then, a photoresist 87 is formed on the epitaxial layer 58. Openings are then formed, by using heretofore known photolithography technology, in the photoresist 87 on regions where P type diffusion layers 88, 89, 90 and 91 are to be formed. Thereafter, ions of a P type impurity, such as boron (B), are implanted under conditions where an accelerating voltage lies between 140 and 180 keV inclusive and a dose lies between $1.0 \times 10^{13}$ and $1.0 \times 10^{15}$ (/c m$^2$) inclusive, thereby to form the P type diffusion layers 88, 89, 90 and 91.

At this time, to selectively etch away the photoresist 87 formed on the epitaxial layer 58, the openings are formed in the photoresist 87 so that the diffusion widths of the P type diffusion layers 89, 90 and 91 are smaller than those of the P type diffusion layers 65, 66 and 67, respectively. Moreover, the ion implantation is performed so that the peaks of impurity concentrations in the P type diffusion layers 89, 90 and 91 are present closer to the surface of the epitaxial layer 58 than the peaks of impurity concentrations in the P type diffusion layers 65, 66 and 67, respectively.

Figure 8:
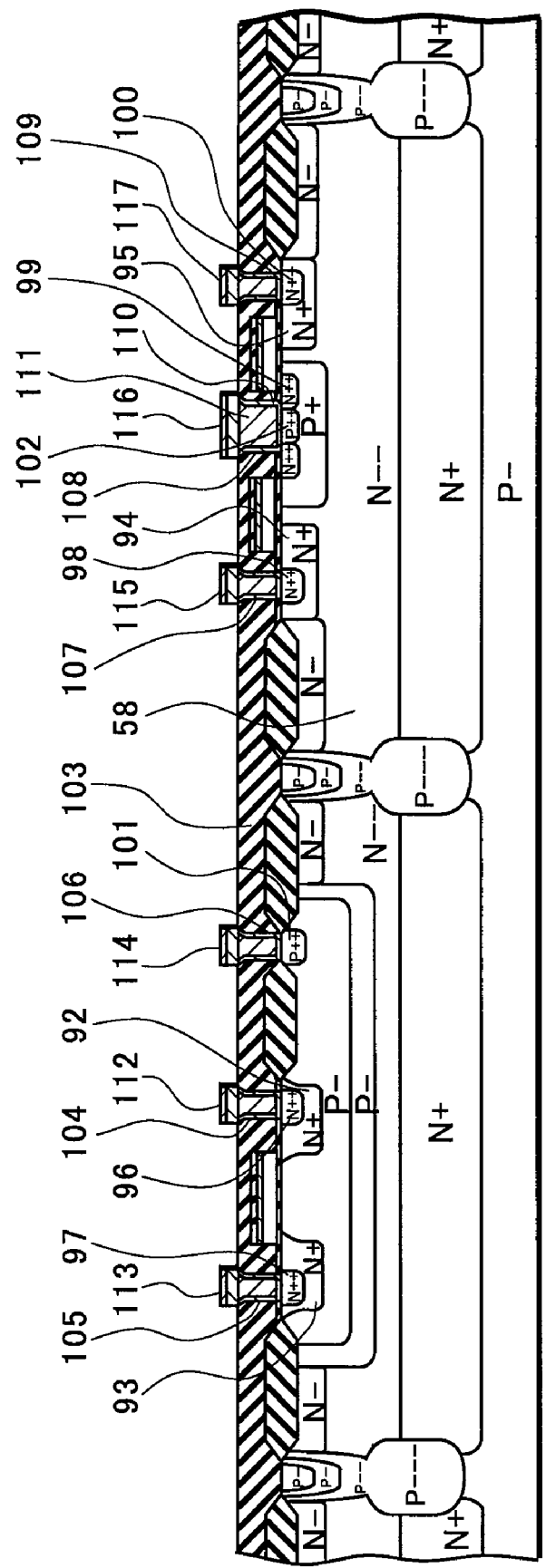
FIG. 8 is a cross-sectional view for explaining the method of manufacturing the semiconductor device according to the embodiment of the present invention.

Then, as shown in FIG. 8, by using heretofore known photolithography technology, ions of an N type impurity, such as phosphorus (P), are implanted to form N type diffusion layers 92, 93, 94 and 95. Thereafter, by using heretofore known photolithography technology, ions of an N type impurity, such as phosphorus (P), are implanted to form N type diffusion layers 96, 97, 98, 99 and 100. Moreover, by using heretofore known photolithography technology, ions of a P type impurity, such as boron (B), are implanted to form P type diffusion layers 101 and 102.

Thereafter, a BPSG (boron phospho silicate glass) film, a SOG (spin on glass) film, or the like, for example, is deposited on the epitaxial layer 58, to thereby form an insulating layer 103 thereon. Then, contact holes 104, 105, 106, 107, 108 and 109 are formed in the insulating layer 103 by using heretofore known photolithography technology for dry etching using $CHF_3+O_2$ base gas, for example. A barrier metal film 110 is formed on an inner wall or the like of each of the contact holes 104, 105, 106, 107, 108 and 109. Thereafter, a tungsten (W) film 111 is buried in each of the contact holes 104, 105, 106, 107, 108 and 109. Then, an aluminum alloy (e.g., Al—Cu or Al—Si—Cu) film and a barrier metal film are sputter deposited on a top surface of each of the tungsten films 111. Thereafter, the aluminum alloy films and the barrier metal films are selectively etched away, by using heretofore known photolithography technology, to thereby form source electrodes 112 and 116, drain electrodes 113, 115 and 117 and a back gate electrode 114. Incidentally, wiring layers connected to the gate electrodes, although not shown in a cross-section of FIG. 8, are provided in other regions.

Incidentally, although the description has been given, in the embodiment, with regard to the case where the P type diffusion layers of the isolation region formed in the epitaxial layer form the triple diffused structure, it is to be understood that the present invention is not limited to this case. For example, one P type diffusion layer, a double diffused structure, or four or more diffusion layers overlapping one another may be employed. Although the description has been given with regard to the embodiment in which the N type epitaxial layer is formed on the P type substrate and the P type isolation regions are formed, it is to be understood that the present invention is not limited to the embodiment. For example, a structure may be employed in which a P type epitaxial layer is formed on an N type substrate and N type isolation regions are formed. It is to be understood that, in addition to the above, various changes and modifications can be made without departing from the gist of the embodiment of the present invention.

According to the present invention, the first conduction type diffusion layer, which constitutes the isolation region, is joined to the second conduction type diffusion layer, which constitutes the semiconductor element, to thereby form the PN junction region. This structure makes it possible to reduce the device size by suppressing the widthwise diffusion of the first conduction type diffusion layer.

Moreover, according to the present invention, in each of the isolation regions, the first conduction type diffusion layers formed from the surface of the epitaxial layer are formed of the plurality of diffusion layers having different impurity concentrations. The diffusion layer having the lowest impurity concentration forms the PN junction regions. This structure makes it possible to improve the withstand voltage characteristics in the isolation regions.

Moreover, according to the present invention, in each of the isolation regions, the first conduction type diffusion layers formed from the surface of the epitaxial layer are formed in a way that a diffusion layer closer to the center thereof has higher impurity concentrations. This structure makes it possible to reduce resistance of the isolation regions, and can prevent inversion of the surface of the isolation regions due to the metal wiring layer.

Furthermore, according to the present invention, the first conduction type diffusion layers which constitute the isolation regions are formed in a way that its widthwise diffusion is suppressed by the second conduction type diffusion layer. This manufacturing method makes it possible for the second conduction type diffusion layer to adjust a formation region of each of the isolation regions, thus making it possible to reduce the device size.

What is claimed is:

1. A semiconductor device comprising:
   a semiconductor substrate comprising a buried diffusion layer formed therein;
   a semiconductor layer disposed on the buried diffusion layer and comprising a first element formation region, a second element formation region and an isolation region isolating the first element formation region from the second element formation region, the isolation region comprising a first impurity diffusion layer of a first general conductivity type and a second impurity diffusion layer of the first general conductivity formed in the first impurity diffusion layer;
   a first semiconductor element formed in the first element formation region and comprising a third impurity diffusion layer of a second general conductivity type formed in the semiconductor layer;
   a second semiconductor element formed in the second element formation region and comprising a fourth impurity diffusion layer of the second general conductivity type formed in the semiconductor layer;
   a fifth impurity diffusion layer of the first general conductivity type disposed under the first impurity diffusion layer,
   wherein the third and fourth impurity diffusion layers form a PN junction with the first impurity diffusion layer and do not form a PN junction with the second impurity diffusion layer formed in the first impurity diffusion layer,
   the second impurity diffusion layer has an impurity concentration higher than the first impurity diffusion layer,
   the fifth impurity diffusion layer forms a PN junction with the buried diffusion layer, and
   the fifth impurity diffusion layer has an impurity concentration lower than the first impurity diffusion layer.

2. The semiconductor device of claim 1, further comprising a sixth impurity diffusion layer of the first general conductivity type formed in the second impurity diffusion layer and having an impurity concentration higher than the second impurity diffusion layer.

3. The semiconductor device of claim 1, wherein the semiconductor layer further comprises an epitaxial layer disposed between the buried diffusion layer and the third and fourth impurity diffusion layers.

* * * * *